US006878402B2

(12) United States Patent
Chiang et al.

(10) Patent No.: US 6,878,402 B2
(45) Date of Patent: Apr. 12, 2005

(54) METHOD AND APPARATUS FOR IMPROVED TEMPERATURE CONTROL IN ATOMIC LAYER DEPOSITION

(75) Inventors: Tony P. Chiang, Santa Clara, CA (US); Karl F. Leeser, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 608 days.

(21) Appl. No.: 09/854,092

(22) Filed: May 10, 2001

(65) Prior Publication Data

US 2002/0066411 A1 Jun. 6, 2002

Related U.S. Application Data (60) Provisional application No. 60/254,280, filed on Dec. 6, 2000, and provisional application No. 60/251,795, filed on Dec. 6, 2000.

(51) Int. Cl.[7] .............................................. C23C 16/00
(52) U.S. Cl. .................... 427/248.1; 427/596; 427/252; 427/255.7
(58) Field of Search ............................. 427/248.1, 252, 427/255.7, 596

(56) References Cited

U.S. PATENT DOCUMENTS

| | | |
|---|---|---|
| 4,534,842 A | 8/1985 | Arnal et al. |
| 4,563,367 A | 1/1986 | Sherman |
| 4,745,337 A | 5/1988 | Pichot et al. |
| 5,061,838 A | 10/1991 | Lane et al. |
| 5,102,687 A | 4/1992 | Pelletier et al. |
| 5,223,457 A | 6/1993 | Mintz et al. |
| 5,227,695 A | 7/1993 | Pelletier et al. |
| 5,270,247 A * | 12/1993 | Sakuma et al. ............... 117/89 |
| 5,483,919 A | 1/1996 | Yokoyama et al. |

(Continued)

OTHER PUBLICATIONS

T.P. Chiang, et al., "Ion-induced chemical vapor deposition of high purity Cu films at room temperature using a microwave discharge H atom beam source," Journal Vacuum Science Technology, Sep./Oct. 1997, p. 2677–2686, vol. A 15(5), American Vacuum Society.

T.P. Chiang, et al., "Surface kinetic study of ion-induced chemical vapor deposition of copper for focused ion beam applications," Journal Vacuum Science Technology, Nov./Dec. 1997, p. 3104–3114, vol. A 15(6), American Vacuum Society.

K.A. Ashtiani, et al., A New Hollow–Cathode Magnetron Source for 0.10μm Copper Applications, Novellus Systems, Inc., San Jose, CA.

Xiaomeng Chen, et al., "Low temperature plasma–promoted chemical vapor deposition of tantalum from tantalum pentabromide for copper metallization," Journal Vacuum Science Technology, Sep./Oct. 1998, p. 2887–2890, vol. B 16(5), American Vacuum Society.

(Continued)

*Primary Examiner*—Timothy Meeks
(74) *Attorney, Agent, or Firm*—Patent Law Group LLP (57) ABSTRACT

A system and method for that allows one part of an atomic layer deposition (ALD) process sequence to occur at a first temperature while allowing another part of the ALD process sequence to occur at a second temperature. In such a fashion, the first temperature can be chosen to be lower such that decomposition or desorption of the adsorbed first reactant does not occur, and the second temperature can be chosen to be higher such that comparably greater deposition rate and film purity can be achieved. Additionally, the invention relates to improved temperature control in ALD to switch between these two thermal states in rapid succession. It is emphasized that this abstract is provided to comply with rules requiring an abstract. It is submitted with the understanding that it will not be used to interpret or limit the scope or meaning of the claims.

19 Claims, 5 Drawing Sheets

U.S. PATENT DOCUMENTS

| | | |
|---|---|---|
| 5,536,914 A | 7/1996 | Pelletier et al. |
| 5,582,947 A | 12/1996 | Shirai et al. |
| 5,605,637 A | 2/1997 | Shan et al. |
| 5,653,811 A | 8/1997 | Chan |
| 5,666,023 A | 9/1997 | Pelletier |
| 5,702,530 A | 12/1997 | Shan et al. |
| 5,916,365 A | 6/1999 | Sherman |
| 6,054,016 A | 4/2000 | Tuda et al. |
| 6,080,446 A | 6/2000 | Tobe et al. |
| 6,103,304 A | 8/2000 | Mizuno |
| 2003/0031787 A1 * | 2/2003 | Doan .................... 427/226 |
| 2003/0073308 A1 * | 4/2003 | Mercaldi ............... 438/680 |
| 2003/0175423 A1 * | 9/2003 | Saenger et al. ......... 427/248.1 |

OTHER PUBLICATIONS

Xiaomeng Chen, et al., "Low temperature plasma–assisted chemical vapor deposition of tantalum nitride from tantalum pentabromide for copper metallization," Journal Vacuum Science Technology, Jan./Feb. 1999, p. 182–185, vol. B 17(1), American Vacuum Society.

Per Martensson, "Atomic Layer Epitaxy of Copper," Comprehensive Summaries of Uppsala Dissertations from the Faculty of Science and Technology, 1999, p. 1–45, Acta Universitatis Upsaliensis, Uppsala, Sweden.

Per Martensson, et al., "Atomic Layer Epitaxy of Copper on Tantalum," Chemical Vapor Deposition, 1997, p. 45–50, vol. 3 No. 1, Weinheim.

Mikko Ritala, et al., "Controlled Growth of TaN, Ta3N5, and TaOxNy Thin Films by Atomic Layer Deposition," Chemical Materials, 1999, p. 1712–1718, vol. 11 No. 7, American Chemical Society.

U.S. Appl. No. 09/812,285, Tony P.Chiang, A Sequential Method for Depositing a Film by Modulated Ion–Induced Atomic Layer Deposition (MII–ALD), filed Mar. 19, 2001.

U.S. Appl. No. 09/812,352, Tony P. Chiang, System and Method for Modulated Ion–Induced Atomic Layer Deposition (MII–ALD), filed Mar. 19, 2001.

U.S. Appl. No. 09/812,486, Tony P. Chiang, A Continuous Method for Depositing a Film by Modulated Ion–Induced Atomic Layer Deposition (MII–ALD), filed Mar. 19, 2001.

* cited by examiner

METHOD AND APPARATUS FOR IMPROVED TEMPERATURE CONTROL IN ATOMIC LAYER DEPOSITION

CROSS-REFERENCE TO RELATED APPLICATIONS

This application claims the benefit of U.S. Provisional Application No. 60/251,795, filed Dec. 6, 2000, and U.S. Provisional Application No. 60/254,280, filed Dec. 6, 2000.

BACKGROUND OF THE INVENTION

1. Field of the Invention

The present invention relates to the field of film deposition, and more particularly, to a method and apparatus for improving and enhancing temperature control in atomic layer deposition (ALD).

2. Description of the Background Art

The present invention relates generally to the field of advanced thin film deposition methods commonly used in the semiconductor, data storage, flat panel display, as well as allied and other industries. More particularly, the present invention relates to improved atomic layer deposition whereby the kinetics of the adsorption of the first precursor and the subsequent reaction with the second precursor are decoupled. By decoupling, we mean causing the reaction (i.e., adsorption) of the first precursor to occur at a different temperature state than the temperature state required for the reaction with the second precursor. More importantly, methods and apparatus for improved temperature control in ALD are disclosed that can switch between these two thermal states in rapid succession.

The disadvantages of conventional ALD are additionally discussed in copending applications with the same assignee entitled "Sequential Method For Depositing A Film By Modulated Ion-Induced Atomic Layer Deposition (MII-ALD)", "System and Method for Modulated Ion Induced Atomic Layer Deposition (MII-ALD)", and "Continuous Method For Depositing A Film By Modulated Ion-Induced Atomic Layer Deposition (MII-ALD)" which are hereby incorporated by reference in their entirety and may be found as copending utility applications, application Ser. Nos. 09/812,285, 09/812,352, 09/812,486 respectively.

As integrated circuit (IC) dimensions shrink and the aspect ratios of the resulting features increase, the ability to deposit conformal, ultra-thin films on the sides and bottoms of high aspect ratio trenches and vias becomes increasingly important. These conformal, ultra-thin films are typically used as "liner" materials to enhance adhesion, prevent inter-diffusion and/or chemical reaction between the underlying dielectric and the overlying metal, and promote the deposition of a subsequent film.

In addition, decreasing device dimensions and increasing device densities has necessitated the transition from traditional CVD tungsten plug and aluminum interconnect technology to copper interconnect technology. This transition is driven by both the increasing impact of the RC interconnect delay on device speed and by the electromigration (i.e., the self-diffusion of metal along interconnects, thereby affecting reliability) limitations of aluminum based conductors for sub 0.25 $\mu$m device generations. Copper is preferred due to its lower resistivity and higher (more than 10 times) electromigration resistance as compared to aluminum. A single or dual damascene copper metallization scheme is used since it eliminates the need for copper etching and reduces the number of integration steps required. However, the burden now shifts to the metal deposition step(s) as the copper must fill predefined high aspect ratio trenches and/or vias in the dielectric. Electroplating has emerged as the copper fill technique of choice due to its low deposition temperature, high deposition rate, and potential low manufacturing cost.

Two major challenges exist for copper wiring technology: the barrier and seed layers. Copper can diffuse readily into silicon and most dielectrics. This leads to electrical leakage between metal wires and poor device performance. An encapsulating barrier layer is needed to isolate the copper from the surrounding material (e.g., dielectric, Si), thus preventing copper diffusion and/or reaction with the underlying material (e.g., dielectric, Si). In addition, the barrier layer also serves as the adhesion or glue layer between the patterned dielectric trench or via and the copper used to fill it. The dielectric material can be a low dielectric constant, i.e., low-k material (used to reduce inter- and intra-line capacitance and cross-talk) which typically suffers from poorer adhesion characteristics and lower thermal stability than traditional oxide insulators. Consequently, this places more stringent requirements on the barrier material and deposition method. An inferior adhesion layer will, for example, lead to delamination at either the barrier-to-dielectric or barrier-to-copper interfaces during any subsequent anneal and/or chemical mechanical planarization (CMP) processing steps leading to degradation in device performance and reliability. Ideally, the barrier layer should be thin, conformal, defect free, and of low resistivity so as to not compromise the conductance of the copper metal interconnect structure.

In addition, electroplating fill requires a copper seed layer, which serves to both carry the plating current and act as the nucleation layer. The preferred seed layer should be smooth, continuous, of high purity, and have good step coverage with low overhang. A discontinuity in the seed layer will lead to sidewall voiding, while gross overhang will lead to pinch-off and the formation of top voids.

Both the barrier and seed layers which are critical to successful implementation of copper interconnects require a means of depositing high purity, conformal, ultra-thin films at low substrate temperatures.

Physical vapor deposition (PVD) or sputtering has been adopted as the preferred method of choice for depositing conductor films used in IC manufacturing. This choice has been primarily driven by the low cost, simple sputtering approach whereby relatively pure elemental or compound materials can be deposited at relatively low substrate temperatures. For example, refractory based metals and metal compounds such as tantalum (Ta), tantalum nitride (TaN$_x$), other tantalum containing compounds, tungsten (W), tungsten nitride (WN$_x$), and other tungsten containing compounds which are used as barrier/adhesion layers can be sputter deposited with the substrate at or near room temperature. However, as device geometries have decreased, the step coverage limitations of PVD have increasingly become an issue since it is inherently a line-of-sight process. This limits the total number of atoms or molecules which can be delivered into the patterned trench or via. As a result, PVD is unable to deposit thin continuous films of adequate thickness to coat the sides and bottoms of high aspect ratio trenches and vias. Moreover, medium/high-density plasma and ionized PVD sources developed to address the more aggressive device structures are still not adequate and are now of such complexity that cost and reliability have become serious concerns.

Chemical vapor deposition (CVD) processes offer improved step coverage since CVD processes can be tailored to provide conformal films. Conformality ensures the deposited films match the shape of the underlying substrate, and the film thickness inside the feature is uniform and equivalent to the thickness outside the feature. Unfortunately, CVD requires comparatively high deposition temperatures, suffers from high impurity concentrations which impact film integrity, and have higher cost-of-ownership due to long nucleation times and poor precursor utilization efficiency. Following the tantalum containing barrier example, CVD Ta and TaN films require substrate temperatures ranging from 500° C. to over 800° C. and suffer from impurity concentrations (typically of carbon and oxygen) ranging from several to tens of atomic % concentration. This generally leads to high film resistivities (up to several orders of magnitude higher than PVD), and other degradation in film performance. These deposition temperatures and impurity concentrations make CVD Ta and TaN unusable for IC manufacturing, in particular for copper metallization and low-k integration.

Chen et al. ("Low temperature plasma-assisted chemical vapor deposition of tantalum nitride from tantalum pentabromide for copper metallization", J. Vac. Sci. Technol. B 17(1), pp. 182–185 (1999); and "Low temperature plasma-promoted chemical vapor deposition of tantalum from tantalum pentabromide for copper metallization", J. Vac. Sci. Technol. B 16(5), pp. 2887–2890 (1998)) have demonstrated a plasma-assisted (PACVD) or plasma-enhanced (PECVD) CVD approach using tantalum pentabromide ($TaBr_5$) as the precursor to reduce the deposition temperature. Ta and $TaN_x$ films were deposited from 350° C. to 450° C. and contained 2.5 to 3 atomic % concentration of bromine. Although the deposition temperature has been reduced by increased fragmentation (and hence increased reactivity) of the precursor gases in the gas phase via a plasma, the same fragmentation leads to the deposition of unwanted impurities. Gas-phase fragmentation of the precursor into both desired and undesired species inherently limits the efficacy of this approach.

Recently, atomic layer chemical vapor deposition (AL-CVD) or atomic layer deposition (ALD) has been proposed as an alternative method to CVD for depositing conformal, ultra-thin films at comparatively lower temperatures. ALD is similar to CVD except that the substrate is sequentially exposed to one reactant at a time. Conceptually, it is a simple process: a first reactant is introduced onto a heated substrate whereby it forms a monolayer on the surface of the substrate. Excess reactant is pumped out. Next a second reactant is introduced and reacts with the first reactant to form a monolayer of the desired film via a self-limiting surface reaction. The process is self-limiting since the deposition reaction halts once the initially adsorbed (physi- or chemisorbed) monolayer of the first reactant has fully reacted with the second reactant. Finally, the excess second reactant is evacuated. The above sequence of events comprises one deposition cycle. The desired film thickness is obtained by repeating the deposition cycle the required number of times.

In practice, ALD is complicated by the painstaking selection of a process temperature setpoint wherein both: 1) at least one of the reactants sufficiently adsorbs to a monolayer and 2) the surface deposition reaction can occur with adequate growth rate and film purity. If the substrate temperature needed for the deposition reaction is too high, desorption or decomposition of the first adsorbed reactant occurs, thereby eliminating the layer-by-layer process. If the temperature is too low, the deposition reaction may be incomplete (i.e., very slow), not occur at all, or lead to poor film quality (e.g., high resistivity and/or high impurity content). Since the ALD process is entirely thermal, selection of available precursors (i.e., reactants) that fit the temperature window becomes difficult and sometimes unattainable. Due to the above-mentioned temperature-related problems, ALD has been typically limited to the deposition of semiconductors and insulators as opposed to metals.

Continuing with the TaN example, ALD of TaN films is confined to a narrow temperature window of 400° C. to 500° C., generally occurs with a maximum deposition rate of 0.2 Å/cycle, and can contain up to several atomic percent of impurities including chlorine and oxygen. Chlorine is a corrosive, can attack copper, and lead to reliability concerns. The above process is unsuitable for copper metallization and low-k integration due to the high deposition temperature, slow deposition rate, and chlorine impurity incorporation.

In conventional ALD of metal films, gaseous hydrogen ($H_2$) or elemental zinc (Zn) is often cited as the second reactant. These reactants are chosen since they act as a reducing agent to bring the metal atom contained in the first reactant to the desired oxidation state in order to deposit the end film. Gaseous, diatomic hydrogen ($H_2$) is an inefficient reducing agent due to its chemical stability, and elemental zinc has low volatility (e.g., it is very difficult to deliver sufficient amounts of Zn vapor to the substrate) and is generally incompatible with IC manufacturing. Unfortunately, due to the temperature conflicts that plague the ALD method and lack of kinetically favorable second reactant, serious compromises in process performance result.

In order to address the limitations of traditional thermal or pyrolytic ALD, radical enhanced atomic layer deposition (REALD, U.S. Pat. No. 5,916,365) or plasma-enhanced atomic layer deposition has been proposed whereby a downstream radio-frequency (RF) glow discharge is used to dissociate the second reactant to form more reactive radical species which drives the reaction at lower substrate temperatures. Using such a technique, Ta ALD films have been deposited at 0.16 to 0.5 Å/cycle at 25° C., and up to 1.67 Å/cycle at 250° C. to 450° C. Although REALD results in a lower operating substrate temperature than all the aforementioned techniques, the process still suffers from several significant drawbacks. Higher temperatures must still be used to generate appreciable deposition rates. However, such temperatures are still too high for some films of significant interest in IC manufacturing such as polymer-based low-k dielectrics that are stable up to temperatures of only 200° C. or less. REALD remains a thermal or pyrolytic process similar to ALD and even CVD since the substrate temperature provides the required activation energy for the process and is therefore the primary control means for driving the deposition reaction.

In addition, Ta films deposited using REALD still contain chlorine as well as oxygen impurities, and are of low density. A low density or porous film leads to a poor barrier against copper diffusion since copper atoms and ions have more pathways to traverse the barrier material. Moreover, a porous or under-dense film has lower chemical stability and can react undesirably with overlying or underlying films, or with exposure to gases commonly used in IC manufacturing processes.

Another limitation of REALD is that the radical generation and delivery is inefficient and undesirable. RF (such as 13.56 MHz) plasma generation of radicals used as the second reactant such as atomic H is not as efficient as microwave plasma due to the enhanced efficiency of microwave energy transfer to electrons used to sustain and dissociate reactants introduced in the plasma. Furthermore, having a downstream configuration whereby the radical generating plasma is contained in a separate vessel located remotely from the main chamber where the substrate is situated and using a small aperture to introduce the radicals from the remote plasma vessel to the main chamber body significantly decreases the efficiency of transport of the second radical reactant. Both gas-phase and wall recombination will reduce the flux of desired radicals that can reach the substrate. In the case of atomic H, these recombination pathways will lead to the formation of diatomic $H_2$, a far less effective reducing agent. If the plasma used to generate the radicals was placed directly over the substrate, then the deposition of unwanted impurities and particles can occur similarly to the case of plasma-assisted CVD.

Finally, ALD (or any derivative such as REALD) is fundamentally slow since it relies on a sequential process whereby each deposition cycle is comprised of at least two separate reactant flow and evacuation steps which can occur on the order of minutes with conventional valve and chamber technology. Significant improvements resulting in faster ALD are needed to make it more suitable for commercial IC manufacturing.

SUMMARY OF THE INVENTION

A method for depositing a film on a substrate in a chamber comprising adjusting a temperature of said substrate to a first temperature, introducing a first reactant gas into said chamber, adsorbing substantially at least one monolayer of said first reactant gas onto said substrate, evacuating any excess of said first reactant gas from said chamber, adjusting a temperature of said substrate to a second temperature, introducing a second reactant gas into said chamber to react with said first reactant gas to produce said film on said substrate, and evacuating any excess of said second reactant gas from said chamber; and adjusting a temperature of said substrate to a third temperature.

A system for depositing a film on a substrate in a chamber comprising a means for adjusting a temperature of said substrate to a first temperature, a means for introducing a first reactant gas into said chamber, a means for adsorbing substantially at least one monolayer of said first reactant gas onto said substrate, a means for evacuating any excess of said first reactant gas from said chamber, a means for adjusting a temperature of said substrate to a second temperature, a means for introducing a second reactant gas into said chamber to react with said first reactant gas to produce said film on said substrate, a means for evacuating any excess of said second reactant gas from said chamber, and a means for adjusting a temperature of said substrate to a third temperature.

DETAILED DESCRIPTION OF THE INVENTION

The present invention resolves the ALD temperature dilemma revolving around the use of a single, fixed substrate temperature setpoint as the principal means of controlling or driving the deposition reaction. The present invention does this by allowing one part of the ALD process sequence (e.g., adsorption of the first reactant) to occur at a first temperature (typically lower) while allowing another part of the ALD process sequence (e.g., reaction between the second reactant with the adsorbed first reactant) to occur at a second temperature (typically higher). In such a fashion, the first temperature can be chosen to be a lower level such that decomposition or desorption of the adsorbed first reactant does not occur, and the second temperature can be chosen to be of a higher level such that comparably greater deposition rate and film purity can be achieved. More importantly, the invention relates to methods and apparatuses for improved temperature control in ALD that can switch between these two thermal states in rapid succession. Via these methods and apparatuses, the limitations in precursor choice can be resolved while improving process performance and deposition rate. In particular, precursor choice can be expanded to include metals—a highly desirable class of materials previously not viable with conventional ALD.

Since ALD is by definition a slow process, introducing a second temperature state would typically compete with the desire to increase processing speed, i.e., the ALD flow-evacuate-flow-evacuate sequence would take even longer. This would be especially true in a conventional, isothermal hot-wall or resistively heated pedestal reactor system commonly used for ALD. This is because the reactor or pedestal must be heated to a higher temperature and then cooled to a lower temperature, which can take several minutes, or greater, due to the large thermal masses involved. Since each deposition cycle results in a film thickness of at most one monolayer, the process would be extremely slow (much slower than even conventional ALD and its derivatives) and highly unfavorable for IC device manufacturing. However, methods exist to rapidly impart energy into a substrate (which may be a "bare" substrate, e.g., a silicon wafer before any films have been deposited, or it may be a substrate which may already have had one or more films deposited on its surface), either globally or in a focused or otherwise localized fashion, causing a transient, rather than quasi-static, change in substrate temperature. The substantial process benefits of employing such methods, in particular improved adsorption and stability of the first reactant plus substantially increased deposition rate, significantly outweigh the increased complexity.

Figure 1:
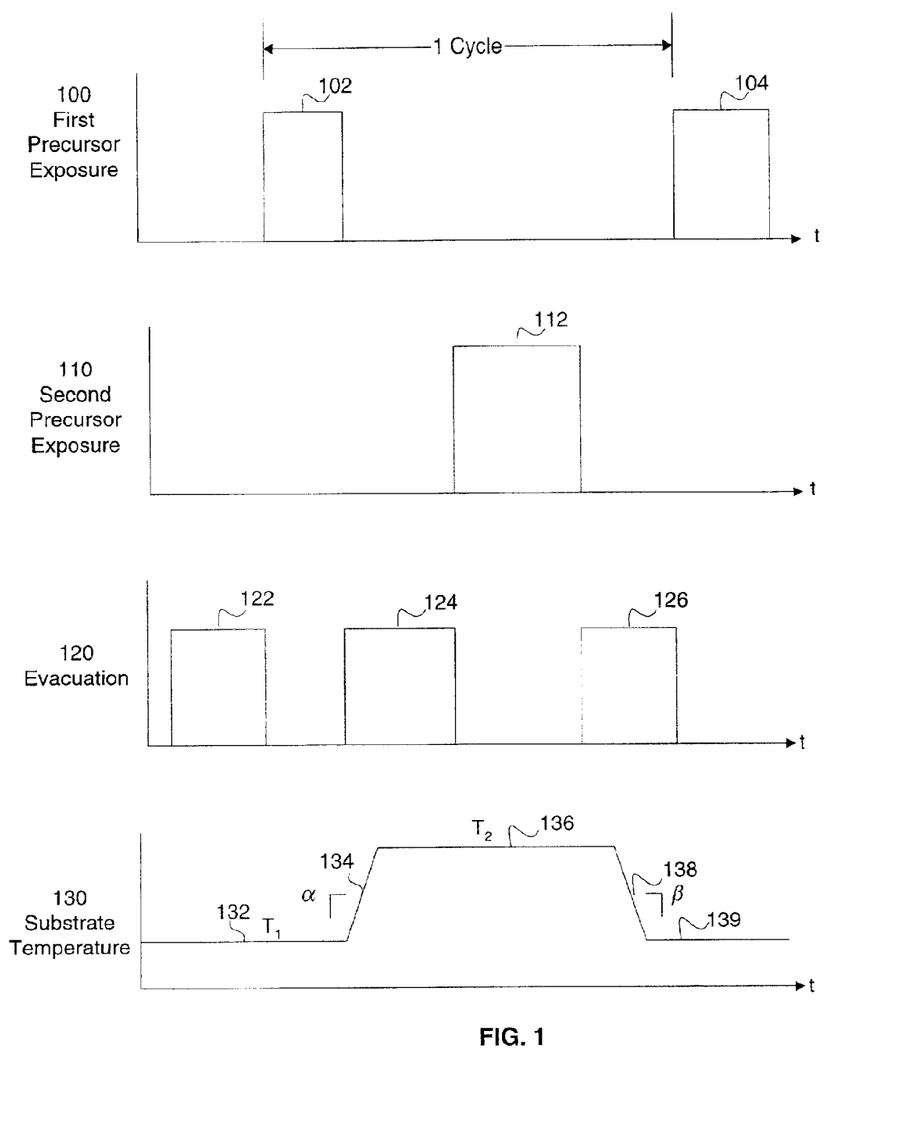
FIG. 1 shows the relative timing diagram of the sequence for the improved ALD method incorporating two (or more) discrete temperature states.
Figure 2:
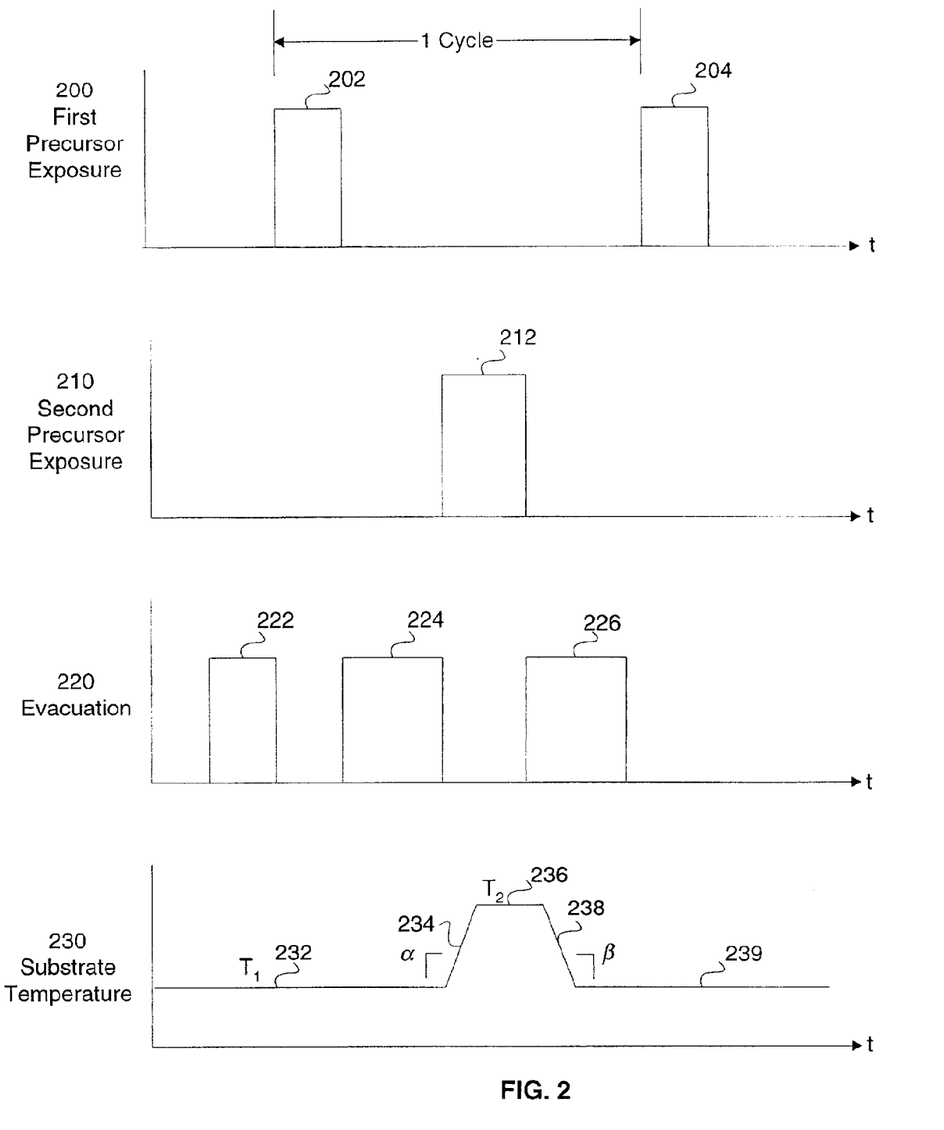
FIG. 2 shows the relative timing diagram of an alternative sequence for the improved ALD method incorporating two (or more) discrete temperature states.

FIG. 1 shows a sequence for an improved ALD method incorporating two (or more) discrete temperature states. In the variant of the method shown in FIG. 1, the substrate temperature is ramped 134 during the evacuation 124 of the first reactant. Note that the time axis is not to scale. FIG. 2 shows an alternative sequence for an improved ALD method incorporating two (or more) discrete temperature states. In the variant of the method shown in FIG. 2, the substrate temperature is ramped 234 during the flow 212 of the second reactant. Again, note that the time axis is not to scale.

An improved ALD sequence incorporating the aforementioned invention is as follows:

1. First exposure 100, 200: A substrate heated (or cooled) to a first temperature, $T_1$ 132, 232, is exposed 102, 202 to a first gaseous reactant, allowing a monolayer of the reactant to form on the surface.
2. First evacuation: The excess reactant is removed by evacuating 124, 224 the chamber with a vacuum pump. An inert gas purge (e.g., Ar or He) can be used in conjunction to speed evacuation/removal of any excess first reactant. In some cases, the purge gas can be diatomic hydrogen ($H_2$) due to its low reactivity to the first reactant.
3. Second exposure 110, 210: The substrate is then heated (or cooled) to a second temperature, $T_2$ 136, 236, where $T_2$ 136, 236 is not equal to $T_1$ 132,232. A second gaseous reactant is introduced 112,212 into the reactor chamber and onto the substrate. The first and second (chemi- or physi-sorbed) reactants react to produce a solid thin monolayer of the desired film. The reaction between the first and second reactants is self-limiting in that the reaction between them terminates after the initial monolayer of the first reactant is consumed.
4. Second evacuation 126,226: The excess second reactant is removed by again evacuating 126, 226 the chamber with the vacuum pump. An inert gas purge (e.g., Ar or He) can be used in conjunction to speed evacuation/removal of any excess first reactant. In some cases, the purge gas can be diatomic hydrogen ($H_2$) due to its low reactivity to the first reactant. The substrate is then cooled (or heated) back to a first temperature, $T_1$ 139, 239.
5. Repeat: The desired film thickness is built up by repeating the entire process cycle (steps 1–4) many times.

Additional precursor gases may be introduced and evacuated as required for a given process to create tailored films of varying compositions or materials.

Preferably, $T_2$ 136, 236 is greater than $T_1$ 132, 232. The first temperature, $T_1$ 132, 232, needs to be low enough so that the first reactant sufficiently forms a monolayer and does not decompose or desorb from the substrate. However, $T_2$ 136, 236 must be high enough in order to drive the deposition reaction and improve film purity. Typically, $T_1$ 132, 232 can range from 20° C. or lower up to 300° C., but more preferably less than 200° C., while $T_2$ 136, 236 can range from 200° C. to 600° C. or greater. The temperatures chosen depend on the reactants used and the types of films being deposited. Of course, $T_1$ 132, 232 could be the ambient temperature state of the substrate initially and, as such, would not be initially heated.

The temperature ramp up rate 134, 234 during heating, $\alpha$, is preferably at least 200° C./sec, and more preferably, higher. The temperature ramp down rate 138, 238 during cooling, $\beta$, is preferably at least 100° C./sec, and more preferably higher. In practice, $\alpha$ is larger than $\beta$.

The methods of the present invention can toggle the substrate surface quickly between two or more temperatures to yield properly decoupled reactions. The energy may be delivered by ions, electrons, photons, or by a thermal energy means that primarily affects the top surface of the substrate undergoing deposition in a transient fashion. Sources for imparting such energy may come from rapid thermal processing (RTP) or laser irradiation. An electron beam may similarly be used. Any of these energy-inducing methods serve to cause a rapid, transient heating of the substrate.

Figure 3:
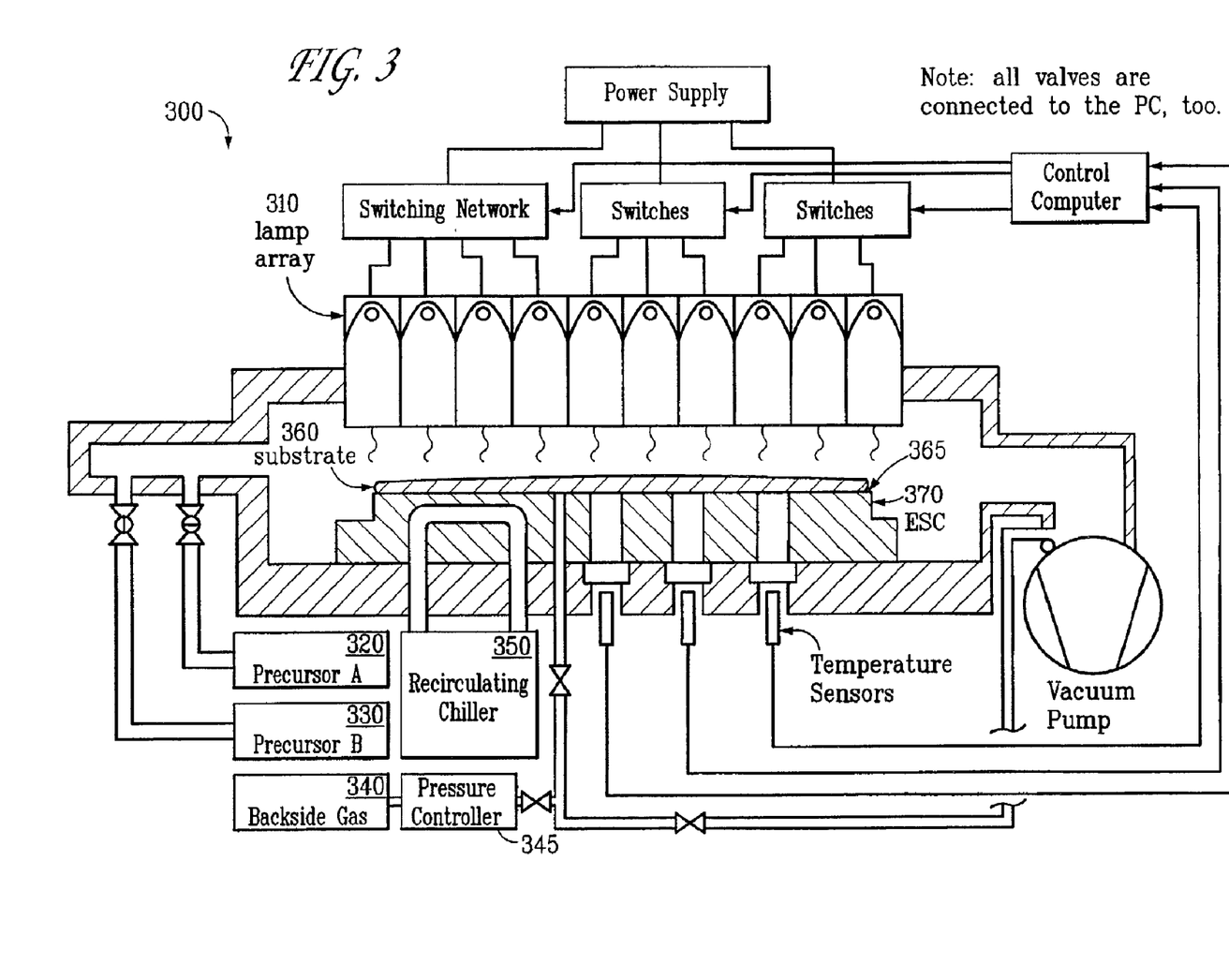
FIG. 3 is the ALD system schematic incorporating a lamp array for rapidly heating, and a chilled electrostatic chuck (ESC) for rapidly cooling, the substrate.

FIG. 3 shows an ALD system schematic incorporating a lamp array 310 for rapidly heating a substrate 360 and a chilled ESC 370 for rapidly cooling the substrate 360. Means for valving and controlling 345 the pressure of the backside gas 340 are also shown. FIG. 3 shows a preferred method of heating the substrate in the manner described herein by rapid thermal processing. RTP refers to a process in which the heating cycle is very rapid and is typically performed via radiant heating 310 utilizing graphite heaters, plasma arc, tungsten halogen lamps, or other means well known in the art. This RTP system 300 is coupled to the substrate 360 such that the substrate 360 surface is brought up to required temperature in seconds (as opposed to minutes for typical isothermal processes) with typical temperature ramp rates of 100–300° C./sec.

Figure 4:
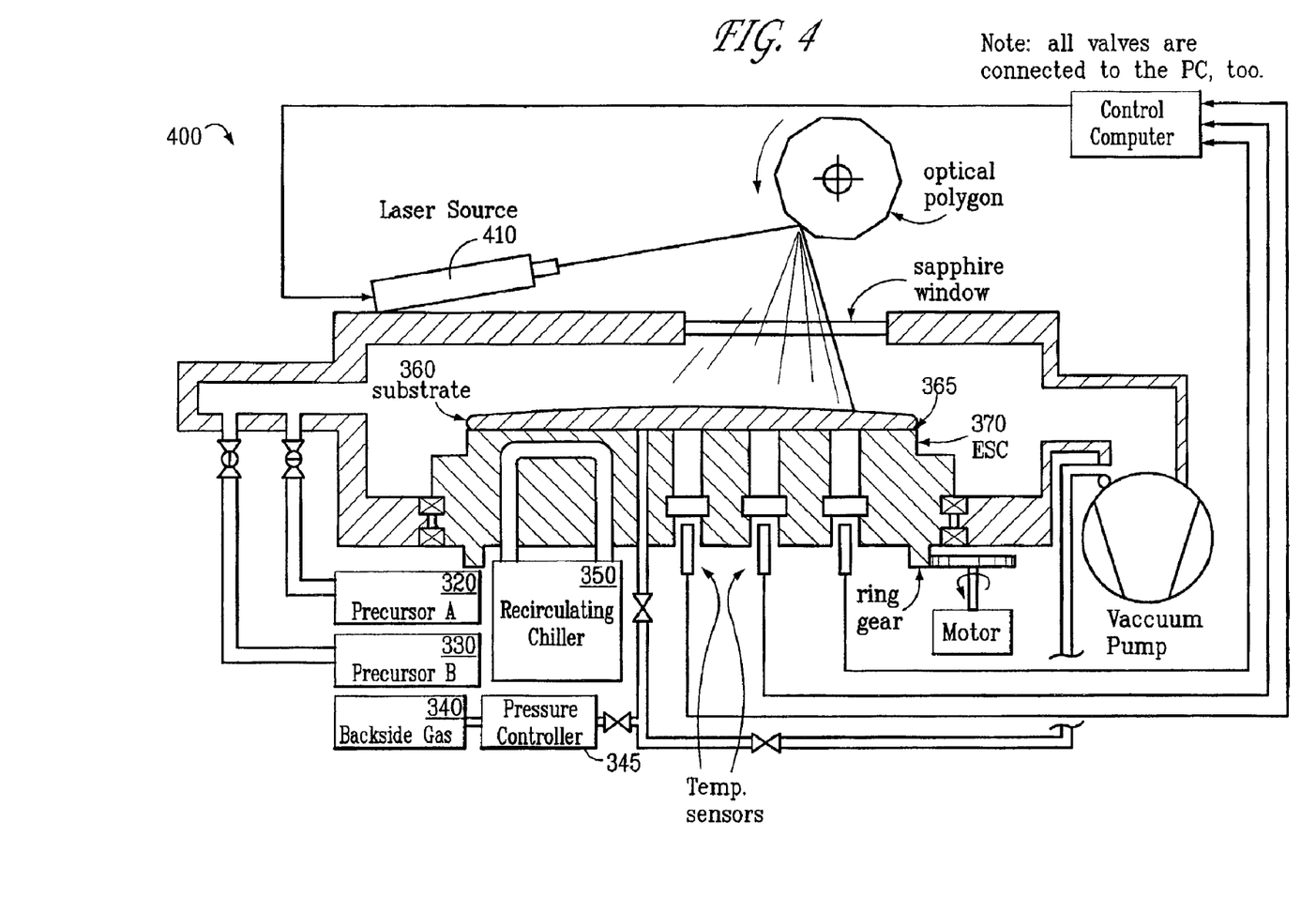
FIG. 4 is the ALD system schematic incorporating a mechanically-scanned laser (coupled with wafer rotation) for rapidly heating, and a chilled electrostatic chuck (ESC) for rapidly cooling, the substrate.

FIG. 4 shows an ALD system schematic incorporating a mechanically-scanned laser 410 (coupled with wafer 360 rotation) for rapidly heating a substrate 360 and a chilled ESC 370 for rapidly cooling the substrate 360. Means for valving and controlling 345 the pressure of the backside gas 340 are also shown. FIG. 4 shows an alternative embodiment where an infrared (IR), ultraviolet (UV), or deep ultraviolet (DUV) laser 410 may be employed to rapidly heat a substrate 360, whereby the beam is scanned rapidly over the entire area of the substrate 360. Alternatively, other forms of irradiation such as extreme-ultraviolet (EUV) or other radiation forms such as x-rays may be employed.

The scanning means is accomplished by methods that are well known in the art. Alternatively, the substrate 360 can be moved with respect to the laser 410 (such as rotating the substrate with respect to a laser line source or point source) so that uniform irradiation of the substrate 360 will occur or the laser 410 may simply scan the entire surface. Laser 410 heating methods may locally heat a substrate 360 with temperature ramp rates of 200–700° C./sec or greater—typically, higher than RTP.

These rapid heating methods reduce the overall thermal budget of the ALD process since the substrate 360 is only at a peak temperature for a short duration of time (on the order of seconds or less). This reduces the overall thermal budget of the process and enables the use of peak temperatures greater than if the substrate 360 was held at a constant temperature for longer periods of time.

Regardless of the energy source used for heating the substrate 360, the substrate 360 must be rapidly cooled, preferably through the use of a cooled pedestal. A cooled pedestal is a substrate 360 holder that retains the wafer 360 or other substrate 360 against a cooled surface and introduces a "backside" gas 340, typically at pressures of 3–10 torr, as a thermal heat transfer medium in the space 365 between them (i.e., the substrate and the cooled pedestal). Thermal coupling between the substrate and pedestal generally increases for increasing gas pressure, but saturates at an upper limit, typically around 10–20 torr depending on gas species, gap spacing, and geometry of the interface. Typical gases used are Ar and He. Although pedestals incorporating clamp rings for retaining the wafer can be used, electrostatic chucks 370, are preferred. ESCs 370 use electrostatic attraction to retain the wafer with a minimal substrate-pedestal gap distance and therefore attain better heat transfer than clamp ring systems. It is known that ESCs 370 can be designed with cooling capacities of approximately 200–350 $W/m^{2°}K$.

In order to achieve the fast temperature ramp up rates discussed previously, the substrate 360 must at times be thermally decoupled from the cooled pedestal so that the energy input is not wasted in heating up the large thermal mass of the pedestal. However, during fast temperature ramp downs, they must be coupled so that the cooled pedestal can efficiently remove heat from the substrate. Since the existence of a backside gas 340 is the primary means of heat transfer between the substrate 360 and the rest of the system in a vacuum or reduced atmosphere environment, a key part of this invention then is this state-based presence of the backside gas 340, or more specifically, the state-based pressure control 345 of the backside gas 340. With suitable valving and pressure control 345, application of wafer 360 backside gas 340 will facilitate thermal coupling between the wafer 360 and a cooled pedestal enabling the low temperature state. Valving off the backside gas 340 thermally decouples the substrate 360 from the cooled pedestal so that a high temperature state can be quickly achieved during RTP lamp 310 or laser 410 irradiation. This method is particularly effective in the semiconductor wafer processing industry since the thermal mass of the substrate 360 is very small, especially compared to a typical cooled pedestal, and the heat fluxes are so large. This sequence is illustrated in FIG. 5.

Figure 5:
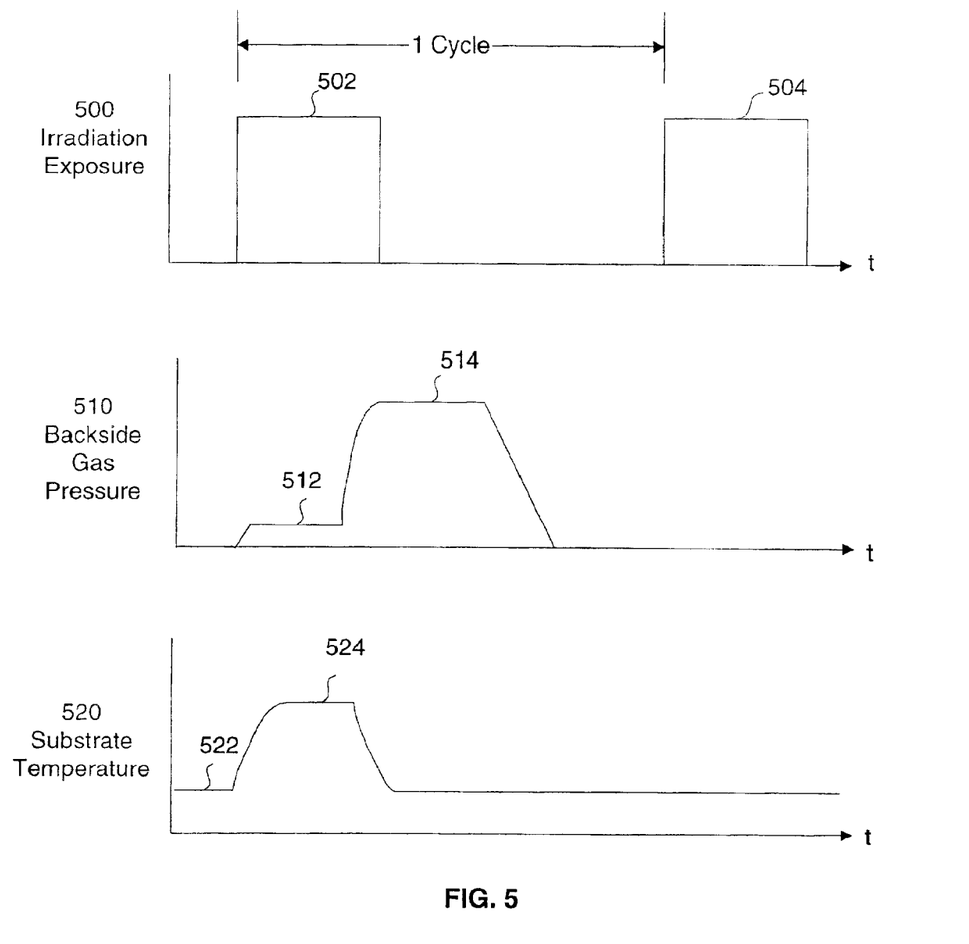
FIG. 5 shows the relative timing diagram of substrate temperature response to irradiation and state-dependent control of backside gas pressure.

FIG. 5 shows substrate temperature 520 response to irradiation 500 and state-dependent control of backside gas pressure 510. FIG. 5 illustrates how the backside gas 340 in conjunction with irradiation 500 can be used to cause the substrate temperature 520 to rapidly change from a low temperature to a high temperature and back to a low temperature state. The cooled pedestal can be cooled via chilled water, gases, or refrigerants to a steady state temperature near or significantly below room temperature (e.g., −40° C. to 20° C.). The pedestal can also be simply maintained at a desired low temperature state greater than room temperature by, for example, resistively warming the heater. In either case, the heat transferring backside gas 340 is used to toggle between the low temperature state 522 (backside gas 340 is "high" 514, e.g., 3–10 torr) of the pedestal to the high temperature state 524 (backside gas 340 is "low" 512, e.g., much less than 3 torr) during RTP 310 or laser 410 irradiation.

It may be conceivable to perform the sequences described in FIGS. 1 and 2 in separate RTP and ALD chambers. However, processing speed would be compromised. A preferable embodiment would be for the sequences described in FIGS. 1 and 2 to be carried out in a single chamber.

From the description of the preferred embodiments of the process and apparatus set forth herein, it will be apparent to one of ordinary skill in the art that variations and additions to the embodiments can be made without departing from the principles of the present invention.

What is claimed is:

1. A method for depositing a film on a substrate in a chamber comprising:

adjusting a temperature of said substrate to a first temperature;

introducing a first reactant gas into said chamber;

adsorbing substantially at least one monolayer of said first reactant gas onto said substrate while said substrate is at the first temperature;

evacuating any excess of said first reactant gas from said chamber;

adjusting a temperature of said substrate to a second temperature, different from said first temperature;

introducing a second reactant gas into said chamber to react with said first reactant gas to produce said film on said substrate while said substrate is at the second temperature;

evacuating any excess of said second reactant gas from said chamber; and adjusting a temperature of said substrate to a third temperature.

2. The method of claim 1, wherein the method is repeated, without the step of adjusting a temperature of said substrate to a first temperature, to deposit an additional film layer.

3. The method of claim 1, wherein said second temperature is greater than said first temperature and said third temperature.

4. The method of claim 3, wherein said first temperature is between about 40° C. and 300° C.

5. The method of claim 3, wherein said first temperature is between about 20° C. and 200° C.

6. The method of claim 3, wherein said second temperature is between about 200° C. and 600° C.

7. The method of claim 3, wherein said third temperature is between about 20° C. and 200° C.

8. The method of claim 1, wherein a temperature ramp rate occurring between said first temperature and said second temperature is at least 200° C. per second.

9. The method of claim 1, wherein a temperature ramp rate occurring between said second temperature and said third temperature is at least 100° C. per second.

10. The method of claim 1, wherein said adjusting a temperature of said substrate to a first temperature, said adjusting a temperature of said substrate to a second temperature, and said adjusting a temperature of said substrate to a third temperature is accomplished by using energy selected from the group consisting of ions, electrons, photons, and thermal energy.

11. The method of claim 10, wherein said adjusting a temperature of said substrate to a first temperature, said adjusting a temperature of said substrate to a second temperature, and said adjusting a temperature of said substrate to a third temperature is accomplished using an energy source selected from a group consisting of a rapid thermal processor, a laser, an electron beam source, and an x-ray source.

12. The method of claim 1, wherein the step of adjusting a temperature of said substrate to a second temperature occurs during the step of evacuating any excess of said first reactant gas.

13. The method of claim 1, wherein, the step of adjusting a temperature of said substrate to a second temperature occurs while introducing a second reactant gas into said chamber.

14. The method of claim 1, wherein said first reactant gas is a metal-containing precursor.

15. The method of claim 1, wherein said third temperature equals said first temperature.

16. A method for depositing a film on a substrate in a chamber comprising:

adjusting a temperature of said substrate to a first temperature and introducing a first reactant gas into said chamber to adsorb substantially at least one monolayer of said first reactant gas onto said substrate while the substrate is at the first temperature, before evacuating any excess of said first reactant gas from said chamber, and adjusting a temperature of said substrate to a second temperature, different from the first temperature, and introducing a second reactant gas into said chamber to react with said first reactant gas to produce said film on said substrate while the substrate is at the second temperature, before evacuating any excess of said second reactant gas from said chamber.

17. The method of claim 16, wherein the method is repeated to deposit additional film layers.

18. The method of claim 16, wherein said second temperature is greater than said first temperature.

19. The method of claim 16, wherein a temperature ramp rate occurring between said first temperature and said second temperature is at least 200° C. per second.

* * * * *